United States Patent [19]
Okagawa et al.

[11] Patent Number: 5,710,440
[45] Date of Patent: Jan. 20, 1998

[54] SEMICONDUCTOR LIGHT EMITTING ELEMENT WITH IN GAALP ACTIVE LAYER OF SPECIFIED THICKNESS

[75] Inventors: Hiroaki Okagawa, Itami; Takayuki Hashimoto, Kuga-gun; Keiji Miyashita, Itami; Tomoo Yamada, Itami; Kazuyuki Tadatomo, Itami, all of Japan

[73] Assignee: Mitsubishi Cable Industries, Ltd., Hyogo, Japan

[21] Appl. No.: 600,295

[22] Filed: Feb. 12, 1996

[30] Foreign Application Priority Data

Feb. 15, 1995 [JP] Japan ............................ 7-026671

[51] Int. Cl.⁶ .................................................. H01L 33/00
[52] U.S. Cl. ............................ 257/96; 257/94; 257/103
[58] Field of Search ............................ 257/96, 103, 94

[56] References Cited

U.S. PATENT DOCUMENTS

| | | | |
|---|---|---|---|
| 5,008,718 | 4/1991 | Fletcher et al. | 257/96 |
| 5,103,270 | 4/1992 | Sato et al. | 257/103 |
| 5,300,791 | 4/1994 | Chen et al. | 257/96 |

FOREIGN PATENT DOCUMENTS

| | | | |
|---|---|---|---|
| 3-283676 | 12/1991 | Japan | 257/96 |
| 4-212479 | 8/1992 | Japan | 257/96 |

*Primary Examiner*—Jerome Jackson
*Assistant Examiner*—Nathan K. Kelley
*Attorney, Agent, or Firm*—Sughrue, Mion, Zinn, Macpeak & Seas, PLLC

[57] ABSTRACT

A semiconductor light emitting element comprising an n-type semiconductor substrate and a light emitting part comprising an n-type cladding layer composed of an InGaAlP compound semiconductor material, an active layer and a p-type cladding layer formed in that order from the substrate side by double heterojunction, wherein said semiconductor light emitting element satisfies at least one of the following conditions:

A. the thickness of said active layer being greater than 0.75 μm and not more than 1.5 μm, and
B. the thickness of said p-type cladding layer being 0.5 μm–2.0 μm. According to the light emitting element of the present invention, an overflow of electron into the p-type cladding layer can be suppressed by setting the thickness of the active layer and the p-type cladding layer to fall within the above-mentioned specific ranges, as a result of which the element shows luminous efficiency peaked within the specified range.

10 Claims, 4 Drawing Sheets

SEMICONDUCTOR LIGHT EMITTING ELEMENT WITH IN GAALP ACTIVE LAYER OF SPECIFIED THICKNESS

FIELD OF THE INVENTION

The present invention relates to a semiconductor light emitting element comprising an InGaAlP compound semiconductor as a material of a light emitting part.

The InGaAlP compound semiconductor material is defined by the formula: $In_y(Ga_{1-x}Al_x)_{1-y}P$ wherein $0 \leq x \leq 1$ and $0 \leq y \leq 1$ (hereinafter simply referred to as InGaAlP material).

BACKGROUND OF THE INVENTION

Of the semiconductor light emitting elements (hereinafter simply referred to as light emitting elements), those having, on a GaAs crystal substrate, a light emitting part having a double heterojunction, which light emitting part being composed of an InGaAlP material, are known to emit lights of from red to green wavelength regions.

For the light emitting elements composed of such material to emit light of a relatively short wavelength region of from yellow to green light, the composition ratio of Al in the compound semiconductor to be used as the material of an active layer needs to be increased.

When the composition ratio of Al is increased, however, a non-radiative recombination in the active layer increases, and luminous efficiency becomes problematically low in the yellow to green light wavelength regions.

SUMMARY OF THE INVENTION

It is therefore an object of the present invention to provide a light emitting element having superior luminous efficiency, which comprises an InGaAlP material as a material of a light emitting part having a double heterojunction structure, wherein the constituting elements of said light emitting element are specified to increase luminous efficiency.

According to the present invention, it has been found that a certain range of the thickness of the active layer, a certain range of the thickness of p-type cladding layer and other conditions of the constituting elements can increase the luminous efficiency.

The semiconductor light emitting element comprising an n-type semiconductor substrate and a light emitting part comprising an n-type cladding layer composed of an InGaAlP compound semiconductor material, an active layer and a p-type cladding layer formed in that order from the substrate side by double heterojunction, wherein said semiconductor light emitting element satisfies at least one of the following conditions:

A. the thickness of said active layer being greater than 0.75 μm and not more than 1.5 μm, and B. the thickness of said p-type cladding layer being 0.5 μm–2.0 μm.

DETAILED DESCRIPTION OF THE INVENTION

The present invention is explained in detail in the following by referring to a light emitting diode (LED) having a typical structure.

Figure 1:
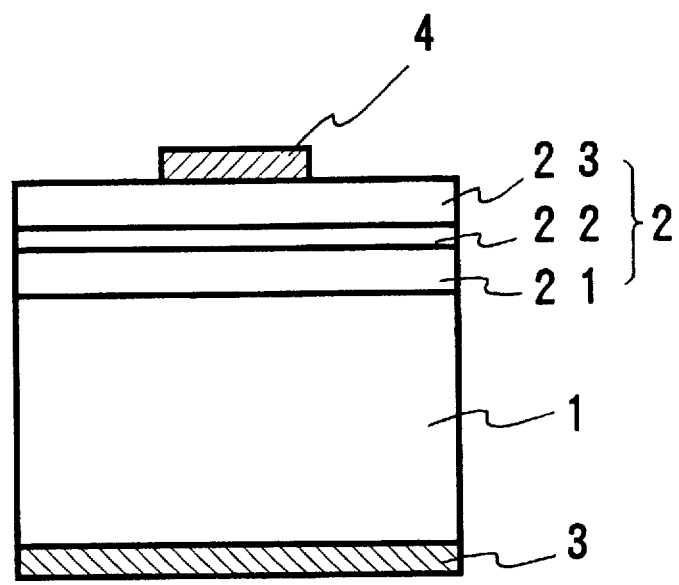
FIG. 1 schematically shows one embodiment of the structure of the light emitting element of the present invention.

The light emitting element shown in FIG. 1 comprises a light emitting pert 2 having a double heterojunction structure formed on an n-type GaAs substrate. The light emitting part 2 is composed of an InGaAlP material, and an n-type cladding layer 21, an active layer 22 and a p-type cladding layer 23 are successively laminated on a GaAs substrate 1 by double heterojunction. Hereinafter an electrode 3 on the substrate side is referred to as a lower electrode and an electrode 4 on the light emitting side is referred to as an upper electrode. In FIG. 1, the electrodes are hatched.

The light emitting element of the present invention comprises a light emitting pert having a double heterojunction structure wherein an InGaAlP material is used for forming said junction. Of such materials, the use of a material defined by the formula: $In_{0.49}(Ga_{1-x}Al_x)_{0.51}P$ ($0 \leq x \leq 1$) to obtain emission of the light of yellow to green wavelength regions is associated with a difficulty in that sufficient barrier height cannot be obtained in the junction surface between the active layer and the cladding layer. When sufficient barrier height is not obtained, a greater injection density of a carrier to be injected into the active layer causes an overflow of the carrier from the active layer to the cladding layer, which ultimately produces lower luminous efficiency. In particular, when the carrier is an electron having a small effective mass, overflowing thereof into a p-type cladding layer becomes noticeable.

In the present invention, such overflow of the electron into the p-type cladding layer is suppressed by setting the thickness of the active layer to a value greater than 0.75 μm. On the other hand, when the thickness of the active layer grows near to the diffusion length of the carrier, the confinement effect of the carrier becomes less to cause low luminous efficiency. The preferable maximum thickness is about 1.5 μm. The thickness of the above-mentioned active layer of 1.1 μm–1.3 μm particularly shows high luminous efficiency, in which range the luminous intensity reaches its peak.

It is preferable to set the thickness of the p-type cladding layer to 0.5 μm–2.0 μm in view of the improvement of luminous efficiency. When the thickness is less than 0.5, the suppression of overflow of the carrier from the active layer to the p-type cladding layer tends to be insufficient. On the other hand, when the thickness exceeds 2.0 μm, the crystallinity is degraded by the thickness of the film to result in a disadvantageous increase in the number of non-radiative recombination centers.

The thickness of the aforementioned active layer and the p-type cladding layer is preferably set to a value which falls within each preferable range to improve the luminous efficiency.

A higher carrier concentration of the cladding layer leads to a higher hetero barrier height in the junction surface with the active layer, thereby suppressing the overflow of the electron from the above-said active layer and affording higher luminous efficiency. However, a higher carrier concentration in the p-type cladding layer leads to a diffusion of p-type dopant such as Zn into the active layer. The diffused dopant acts as non-radiative recombination center and decreases the luminous efficiency. In view of the foregoing, the carrier concentration of the p-type cladding layer in the range of from $5\times10^{16}$ cm$^{-3}$ to $5\times10^{17}$ cm$^{-3}$ is most preferable, in which range the luminous efficiency can be markedly improved.

The dopant to determine the conductivity of each layer is not particularly limited. Examples thereof are Se and Si for n-type layer, and Zn and Mg for p-type layer. In FIG. 1, Zn was used for p-type layer and Se was used for n-type layer.

The semiconductor substrate may be any as long as it can lattice-match well with InGaAlP materials to be used for the light emitting part. In the examples of the present invention, used was GaAs.

Figure 2:
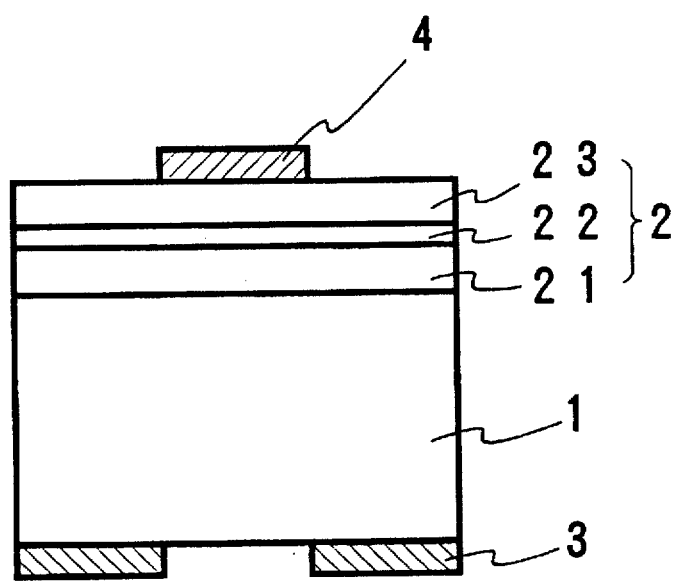
FIG. 2 schematically shows one embodiment of the structure of the light emitting element of the present invention having a current diffusing layer.

It is preferable that a buffer layer having the same composition with said substrate be first formed on the GaAs substrate to improve the quality of crystals. That is, in the examples of the present invention, a GaAs buffer layer having a thickness of about 0.1 μm–1 μm was formed. In FIGS. 1 and 2, the buffer is not shown.

The GaAs substrate absorbs the light from the light emitting part. Accordingly, a Bragg reflecting layer to reflect the light from the light emitting part may be formed between the GaAs substrate and the light emitting part.

The light emitting part is composed of an InGaAlP material. As mentioned earlier, a compound semiconductor material defined by the formula: $In_{0.49}(Ga_{1-x}Al_x)_{0.51}P$ ($0 \leq x \leq 1$) which lattice-matches with the GaAs substrate is preferably used along with the active layer and the p-type cladding layer having a thickness within the above-mentioned specific range. By setting the composition ratio of Al in the active layer to $0 \leq x \leq 0.5$, a light emitting element capable of emitting a red to green light can be obtained. In the example of FIG. 1, a compound wherein x=0.3 was used for the active layer.

When a light emitting part is formed using these materials, the luminous efficiency becomes superior when the thickness of the active layer is more than 0.75 μm and not less than 1.5 μm. In particular, the thickness of the active layer which is within the range of 1.1 μm–1.3 μm is conducive to the highest luminous efficiency, and the luminous intensity reaches its peak in this range.

With respect to the materials to be used for the p-type and n-type cladding layers, x is determined to a value such that the band gap is greater than that of the material to be used for the above-mentioned active layer. In the example of FIG. 1, $In_{0.49}(Ga_{0.3}Al_{0.7})_{0.51}P$ was used, since it can be particularly preferably combined with $In_{0.49}(Ga_{0.3}Al_{0.3})_{0.51}P$ as the material of the aforementioned active layer.

When the light emitting part is formed using the above-mentioned materials, the luminous efficiency can be improved by setting the thickness of the p-type cladding layer to 0.5 μm–2.0 μm, particularly preferably 0.8 μm–1.3 μm.

The preferable range of the carrier concentration of the respective cladding layers is as mentioned above. In the example of FIG. 1, the concentration was set to $3\times10^{17}$cm$^{-3}$ for both the p-type cladding layer and the n-type cladding layer.

The electrode can be that which is made from any known material and can have a known structure. In the example of FIG. 1, AuSn 0.1 μm–Au 0.5 μm was used as the lower electrode 3 on the n-type side and AuBe 0.3 μm–Au 1 μm was used as the upper electrode 4 of the p-type side.

The lower electrode was formed in the entirety of the lower surface of the GaAs substrate shown in FIG. 1. As shown in FIG. 2, however, a lower electrode is preferably not formed in the area which comes right under the upper electrode, since the light from the active layer just under the upper electrode is hindered from transmitting by the upper electrode. In the structure of FIG. 2, however, the current does not easily flow to the area corresponding to the upper electrode, and emission of the light from the area of the active layer that corresponds to the upper electrode is suppressed.

The LED shown in FIG. 1 was actually configurated and its properties were investigated as in the following.

Experiment 1

In this experiment, the changes in the luminous intensity of the LED at 595 nm with varying thickness of the active layer were determined. The thickness of other layers was as follows, wherein the value in the parentheses is the carrier concentration (cm$^{-3}$) of each layer.

| | |
|---|---|
| p-type cladding layer | 1.0 μm ($3 \times 10^{17}$) |
| n-type cladding layer | 0.5 μm ($3 \times 10^{17}$) |
| n-type GaAs buffer layer | 0.5 μm ($4 \times 10^{17}$) |
| n-type GaAs substrate | 350.0 μm ($3 \times 10^{18}$) |

A membrane comprising the above layers was grown by MOCVD. A lower electrode was uniformly formed on the entirety of the rear side of the GaAs substrate, and an upper electrode (120 μm diameter disc) was formed on the p-type cladding layer. This laminate was cut out as pellets having the same planar shape of 350 μm×350 μm, and bonded to a To-18 stem table, which was followed by connecting an Au wire to give an LED. The measure was taken upon application of 20 mA current in the forward direction.

Figure 5:
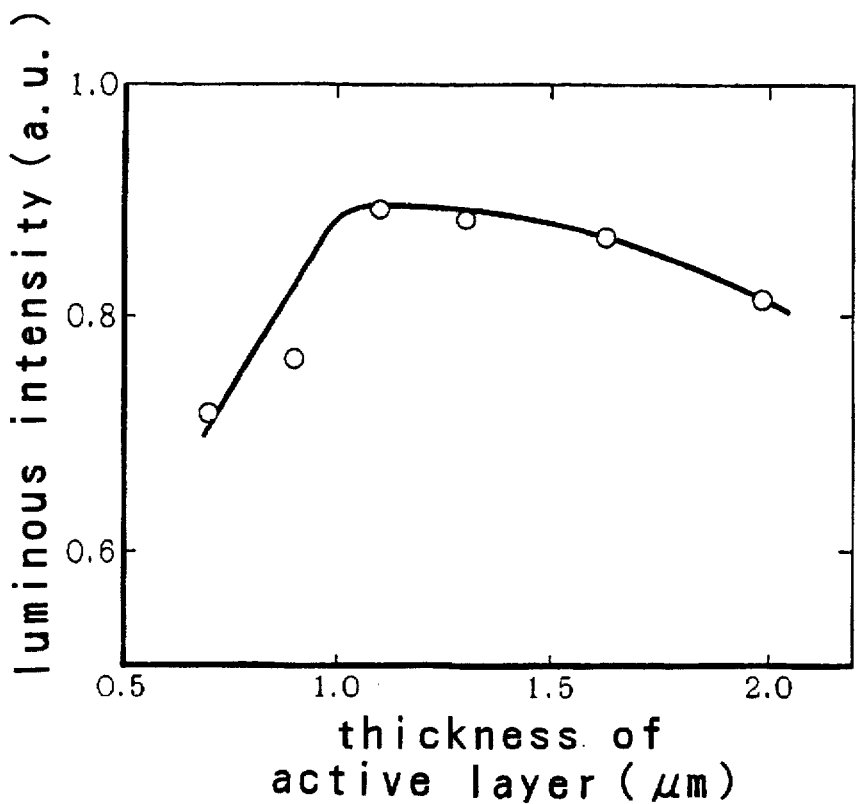
FIG. 5 is a graph showing the relationship between the thickness of the active layer and luminous intensity of the light emitting element of the present invention.

The results are shown in the graph of FIG. 5 as expressed by the relationship between the thickness of the active layer and the luminous intensity. As is evident from FIG. 5, the luminous intensity depicts an upwardly curving line in the thickness range of the active layer of from 0.75 μm to 1.5 μm, with a peak in the vicinity of 1.1 μm–1.3 μm, suggesting an enhanced luminous efficiency in this range.

Experiment 2

Figure 6:
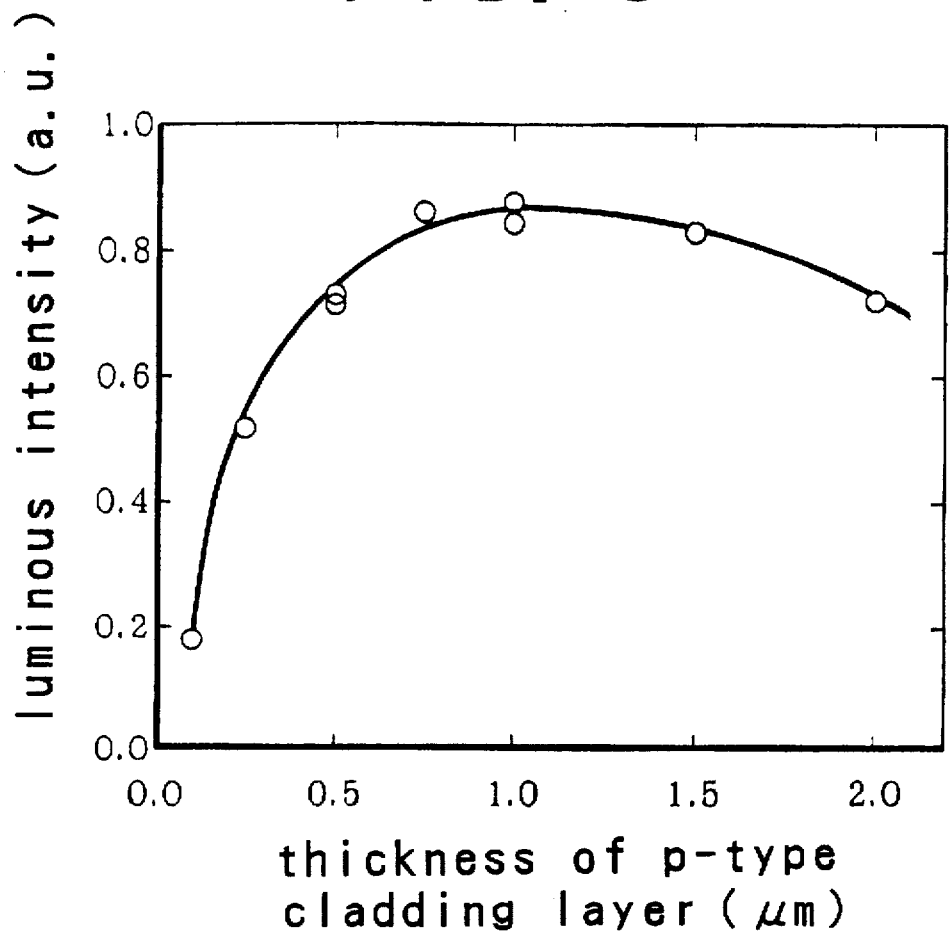
FIG. 6 is a graph showing the relationship between the thickness of the p-type cladding layer and luminous intensity of the light emitting element of the present invention.

In this experiment, the thickness of the active layer of the LED used in the above Experiment 1 was set to 0.7 μm, and the changes in the luminous intensity with varying thickness of the p-type cladding layer were determined. The mode of LED and the experiment conditions were the same as in the above Experiment 1. The results are shown in the graph of FIG. 6 as expressed by the relationship between the thickness of the p-type cladding layer and the luminous intensity. As is evident from FIG. 6, the luminous intensity depicts an upwardly curving line in the thickness range of the p-cladding layer of from 0.5 μm to 2.0 μm, suggesting an enhanced luminous efficiency in this range.

The thickness of the active layer and that of the p-type cladding layer independently affect luminous efficiency. Accordingly, it is most preferable to simultaneously set the thickness to the most preferable values of the respective layers to improve the luminous efficiency.

Another preferable mode of the light emitting element of the present invention is shown in the following.

Figure 3:
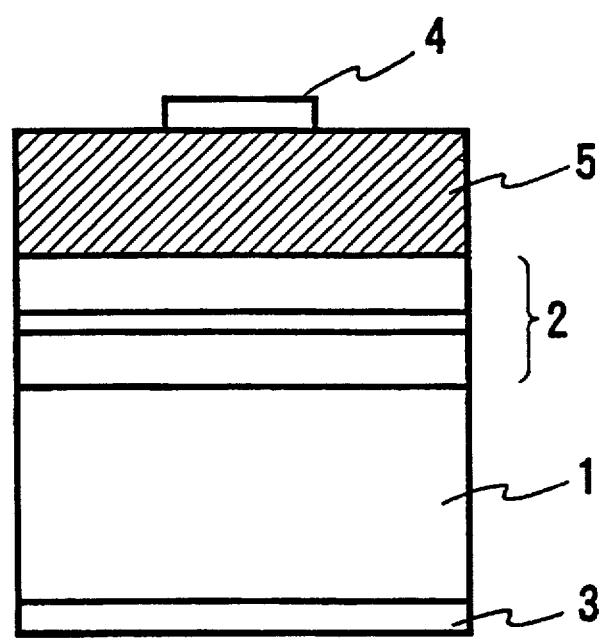
FIG. 3 schematically shows one embodiment of the preferable structure of the electrode of the light emitting element of the present invention.

The light emitting element of the present invention may comprise a current diffusing layer between p-type cladding layer and electrode, as shown in FIG. 3. In the light emitting element of FIG. 3, a light emitting part 2 composed of an InGaAlP material and a current diffusing layer 5 composed of AlGaAs are formed sequentially on an n-type GaAs substrate 1. In addition, a lower electrode 3 and an upper electrode 4 are formed in such a way that the substrate 1, the light emitting part 2 and the current diffusing layer 5 are sandwiched thereby in the laminating direction. In this Figure, the current diffusing layer is hatched.

The current diffusing layer is a semiconductor layer having a high carrier concentration and is formed to increase the distance between the upper electrode and the light emitting part. This layer aids the current from the upper electrode to diffuse over a wider area of the light emitting surface, thereby enabling light emission from a wide area of the active layer. On the other hand, however, the dopant is known to spread from the current diffusing layer to the active layer to result in lower luminous efficiency. Such light emitting element shows steep decrease in the luminous efficiency upon passing current, which is considered to be attributable to the current encouraging the dopant to spread into the active layer.

When the light emitting element has a current diffusing layer, the p-type cladding layer of the present invention also functions to suppress diffusion of the dopant. That is, as described above, the p-type cladding layer suppresses diffusion of the dopant from the current diffusing layer to the active layer, when the carrier concentration of the p-type cladding layer is set to $5 \times 10^{16}$ cm$^{-3}$–$5 \times 10^{17}$ cm$^{-3}$ and the thickness 0.5 µm–2.0 µm, which in turn increases reliability of the light emitting element.

Figure 4:
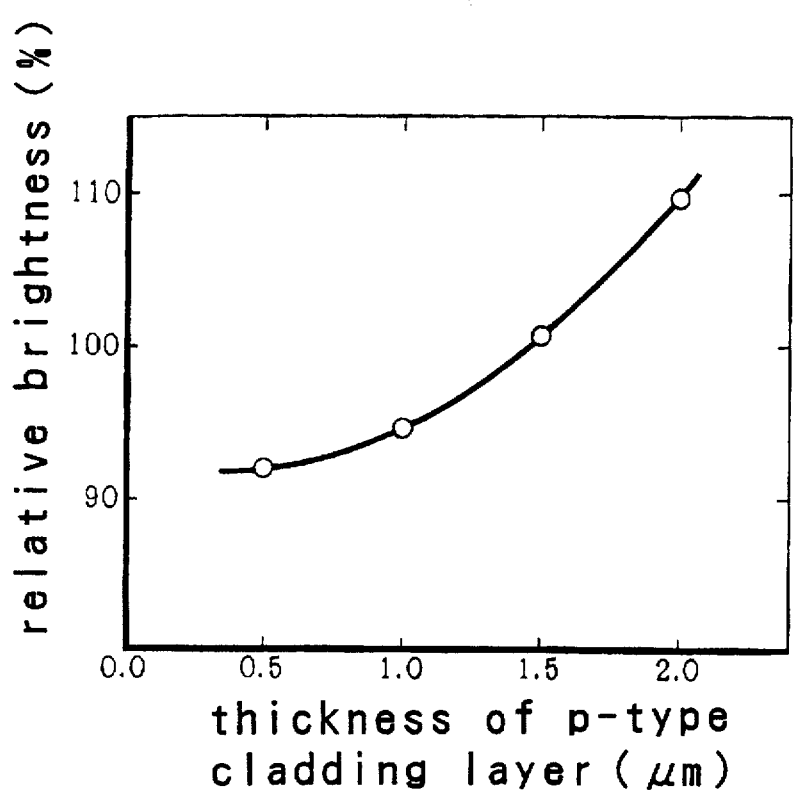
FIG. 4 is a graph showing the relationship between the thickness of the p-type cladding layer and the relative brightness after passing current for a long time through the light emitting element of the present invention having a current diffusing layer.

FIG. 4 shows, in a graph, the relationship between the thickness of the p-type cladding layer and the relative brightness after passing current for a long time through the light emitting element having a current diffusing layer. The relative brightness is a percentage (%) of the brightness after flowing current for a predetermined time, relative to that at the initial stage of the current flow. The current flowing conditions were 25° C., 50 mA and 500 hr.

As is evident from the graph of FIG. 4, a light emitting element having a thicker p-type cladding layer showed higher relative brightness after current flow for a long time, thus proving higher reliability of the element. In view of the reliability of the element, the p-type cladding layer is preferably thick, though too thick a p-type cladding layer leads to lower luminous efficiency, and the aforementioned thickness within the range of from 0.5 µm to 2.0 µm is the optimal thickness.

As detailedly described in the foregoing, a light emitting element comprising an n-type semiconductor substrate, particularly an n-type GaAs substrate, and a light emitting part formed thereon, which has a double heterojunction structure and which is composed of an InGaAlP material, can achieve a superior luminous efficiency by setting the thickness of the active layer to a value greater than 0.75 µm and not more than 1.5 µm and/or setting the thickness of the p-type cladding layer to fall within the range of from 0.5 µm to 2.0 µm.

When a current diffusing layer is formed between the p-type cladding layer and the electrode, the p-type cladding layer in the present invention also functions to suppress diffusion of the dopant to ultimately suppress degradation of luminous efficiency with time, whereby a dependable light emitting element can be provided.

What is claimed is:

1. A semiconductor light emitting element comprising an n-type semiconductor substrate and a light emitting part composed of an InGaAlP compound semiconductor material, said light emitting part comprising an n-type cladding layer, an active layer and a p-type cladding layer in this order from the substrate side to form a double heterojunction, and said active layer having a thickness of greater than 0.75 µm and not more than 1.5 µm.

2. The semiconductor light emitting element of claim 1, wherein the semiconductor substrate is a GaAs substrate and InGaAlP compound semiconductor material is defined by formula: In$_{0.49}$(Ga$_{1-x}$Al$_x$)$_{0.51}$P(0≦x≦1).

3. The semiconductor light emitting element of claim 1, wherein the carrier concentration of the p-type cladding layer is $5 \times 10^{16}$ cm$^{-3}$–$5 \times 10^{17}$ cm$^{-3}$.

4. The semiconductor light emitting element of claim 1, wherein the thickness of the active layer is 1.1 µm–1.3 µm.

5. The semiconductor light emitting element of claim 1, wherein a current diffusing layer is further formed on the p-type cladding layer.

6. A semiconductor light emitting element comprising an n-type semiconductor substrate and a light emitting part composed of an InGaAlP compound semiconductor material, said light emitting part comprising an n-type cladding layer, an active layer and a p-type cladding layer in this order from the substrate side to form a double heterojunction, said active layer having a thickness of greater than 0.75 µm and not more than 1.5 µm, and said p-type cladding layer having a thickness of 0.5–2.0 µm.

7. The semiconductor light emitting element of claim 6, wherein the semiconductor substrate is a GaAs substrate and the InGaAlP compound semiconductor material is defined by the formula: In$_{0.49}$(Ga$_{1-x}$Al$_x$)$_{0.51}$P (0≦x≦1).

8. The semiconductor light emitting element of claim 6, wherein the carrier concentration of the p-type cladding layer is $5 \times 10^{16}$ cm$^{-3}$–$5 \times 10^{17}$ cm$^{-3}$.

9. The semiconductor light emitting element of claim 6, wherein the thickness of the active layer is 1.1 µm–1.3 µm.

10. The semiconductor light emitting element of claim 6, wherein a current diffusing layer is further formed on the p-type cladding layer.

* * * * *